United States Patent [19]

D'Luna et al.

[11] Patent Number: 5,008,739

[45] Date of Patent: Apr. 16, 1991

[54] REAL-TIME DIGITAL PROCESSOR FOR PRODUCING FULL RESOLUTION COLOR SIGNALS FROM A MULTI-COLOR IMAGE SENSOR

[75] Inventors: Lionel J. D'Luna; Robert H. Hibbard; Kenneth A. Parulski, all of Rochester, N.Y.

[73] Assignee: Eastman Kodak Company, Rochester, N.Y.

[21] Appl. No.: 310,419

[22] Filed: Feb. 13, 1989

[51] Int. Cl.$^5$ .......................... H04N 9/07; H04N 9/04
[52] U.S. Cl. .................... 358/21 R; 358/44; 358/41; 358/37
[58] Field of Search .................. 358/44, 48, 21 R, 13, 358/30, 37, 80, 75

[56] References Cited

U.S. PATENT DOCUMENTS

| | | |
|---|---|---|
| 3,971,065 | 7/1976 | Bayer . |
| 4,216,503 | 8/1980 | Wiggins . |
| 4,395,730 | 7/1983 | Shen . |
| 4,506,290 | 3/1985 | Hashimoto . |
| 4,507,676 | 3/1985 | Dischert et al. . |
| 4,525,741 | 6/1985 | Chahal et al. . |
| 4,544,945 | 10/1985 | Lewis, Jr. et al. ................... 358/30 |
| 4,589,019 | 5/1986 | Dischert et al. . |
| 4,590,512 | 5/1986 | Kondo . |
| 4,595,946 | 6/1986 | Uehara et al. . |
| 4,602,291 | 7/1986 | Temes . |
| 4,605,956 | 8/1986 | Cok . |
| 4,616,253 | 10/1986 | Hashimoto et al. . |
| 4,620,277 | 7/1986 | Guichard . |
| 4,630,102 | 12/1986 | Wargo et al. . |
| 4,642,678 | 2/1982 | Cok ........................................ 358/44 |
| 4,663,661 | 5/1987 | Weldy et al. . |
| 4,736,241 | 4/1988 | Murakami et al. . |
| 4,912,558 | 3/1990 | Easterly et al. ................. 358/213.19 |
| 4,945,406 | 7/1990 | Cok ........................................ 358/80 |
| 4,962,419 | 10/1990 | Hibbard et al. ........................ 358/37 |

FOREIGN PATENT DOCUMENTS 289944 11/1988 European Pat. Off. .

OTHER PUBLICATIONS

"A Realtime Image Processing Chip Set," IEEE ISSC Digest Feb. 20, 1986, pp. 148–149.
IEEE 1988 Int'l Conf. on Cons. Elec Digest of Technical Papers ICCE Jun. 8–10 1988, Nicoh, pp. 4–5.
A Basic Approach to a Digital Color Camera System, IEEE Trans on Cons. Elec. vol. CE-30, No. 3, Aug. 1984, pp. 409–415.
A CMOS Two Dimensional Digest Filter for TV Pictures, IEEE ISSC Conf., Feb. 20, 1986, pp. 146–147, Ser. No. 07/290,729, filed Jan. 9, 1989 Easterly et al.

Primary Examiner—Howard W. Britton
Assistant Examiner—Michael H. Lee
Attorney, Agent, or Firm—David M. Woods

[57] ABSTRACT

A digital processing system is described for processing luminance and chrominance signals from a single, multi-color image sensor. By concentrating signal improvements and corrections into an application-dependent post-processing phase, the pre-processing functions are isolated in a signle, generic pre-processor integrated circuit that provides fully interpolated color signals in a real-time system by utilizing a fully pipelined architecture. The pre-processor circuit separates luminance and chrominance interpolation so as to operate partly in quantized linear space and partly in quantized logarithmic space. The image signals are processed in a black reference clamp, a defect concealment circuit and a color separation and luminance interpolation circuit in linear space, using right shifts and additions to approximate predetermined multiplications. The signals are then transformed into hue signals and processed in log space for white balance and chroma (hue) interpolation. With the log green signal separately adjusted for gain, quantized red, green and blue signals are output from the pre-processor integrated circuit.

9 Claims, 6 Drawing Sheets

REAL-TIME DIGITAL PROCESSOR FOR PRODUCING FULL RESOLUTION COLOR SIGNALS FROM A MULTI-COLOR IMAGE SENSOR

BACKGROUND OF THE INVENTION

1. Field of the Invention

This invention relates to the field of digital signal processing and, more specifically, to digital processing of image signals obtained from a multi-color image sensor.

2. Description Relative to the Prior Art

There are practical limitations on the sophistication of signal processing in an analog video system, which in turn limits the image quality such a system is capable of producing. Digital signal processing offers a technique for more sophisticated processing, thus offering the promise of higher image quality. In designing a fully digital camera system, the fundamental structure of the system is ordinarily based on transposing the elements of a conventional analog video camera system from the analog to the digital domain. This, for example, is seen in the digital system proposed by Nikoh et al ("The Full Digital Video Camera System and Simulation of Its Essential Parameters," by H. Nikoh and T. Kuwajima, Digest of Technical Papers, International Conference on Consumer Electronics, June 1988, pp 4–5). Most processing is done digitally, including pixel error correction, color separation, white balance, gamma correction, color difference signal generation, aperture compensation and noise reduction. A similarly comprehensive digital architecture is seen in EPO patent application No. 289,944 (published Nov. 9, 1988), wherein an electronic digital still camera performs color separation, white balance adjustment and gamma correction prior to storing the processed signals in a digital memory. Such direct transpositions from analog to digital ordinarily involve a quantization space in which the quantization increments are linearly related to the sensor signal level.

There are occasions, however, when it may be advantageous to do the digital signal processing in other than linear space. For instance, in Ser. No. 07/290,729, filed Dec. 27, 1988 in the name of Easterly et al and entitled "Optical Image to Video Transfer System Having Enhanced Resolution And Contrast For Dark Areas of the Image, (now U.S. Pat. No. 4,912,558) "which is assigned to the assignee of the present application, the analog pixel values produced by a single chip, multi-color CCD image sensor are digitized and converted into a log exposure space, that is, digital code words are generated that have a logarithmic relationship to the input signal amplitudes. The interpolation of all colors is then carried out in log space. Certain operations, however, such as black level correction, must be completed in a space linearly related to the sensor signal level. This is the case because misadjustment of the black level can manifest itself as a color shift if the transfer functions of the sensor and the linear-to-log conversion are mismatched. Consequently, in Ser. No. 07/290,729, the black level of the analog sensor signal is corrected before it is digitized.

The arrangement of the processing architecture is complicated by the fact that certain operations, like multiplication, are inconvenient to implement in a linear digital process. Color signal interpolation requires multiplications or divisions, but these operations are usually by known coefficients that can be implemented, or at least closely approximated, by hard-wired shifts and adds. Other operations, like white balance, involve scene-dependent multiplications that cannot be readily hard-wired into a linear digital circuit. These operations are more readily accomplished in log space as additions.

It would appear desirable to partition the digital process according to the space domain most suitable for the individual operations. This alone, however, does not insure a flexible and streamlined digital architecture since the priority of operations may involve numerous transformations between spaces. For example, while interpolation (itself best done in linear space) follows linear black level correction, the separated chrominance colors should be white balanced (in log space, because of multiplications) before the chroma is interpolated. Moreover, certain operations, like gamma correction, edge enhancement, and color correction might better be done in either space depending on the nature of the correction. What is more, such operations are ordinarily limited to certain applications-such as a particular form of output-and thus impact upon flexibility of the digital process.

SUMMARY OF THE INVENTION

The present invention streamlines and simplifies the digital architecture by first separating interpolation into two distinct parts: luminance interpolation and chrominance interpolation. While this alone may seem at most a subtle improvement, it is the basis for a concatenation of additional improvements directed to space partitioning that produces a markedly improved architecture. First, it is known that chroma interpolation is more effective if done in terms of hue rather than the chroma-bearing (red or blue) values alone. This tends to reduce false colors in areas with significant luminance detail. The present invention further recognizes that dealing with hue insures that the eye is insensitive to slight misadjustments in the hue due to a non-linear interpolation of the chroma-bearing colors . . . as long as the chrominance is accurately known at both ends of the interpolated distance. Consequently, the luminance is interpolated in linear space for accuracy, and the chrominance (or hue) is interpolated in log space, mainly for convenience and simplicity. This allows an advantageous grouping of operations that minimizes functional elements without a serious impact upon image quality.

To further streamline the digital architecture and maximize its flexibility, the processing chain is segmented into a signal pre-processor that produces a fully interpolated, uncorrected color signal and a post-processor that provides application-dependent signal improvements and corrections, such as gamma correction, color matrixing, edge enhancement and the like. The signal pre-processor thus becomes a relatively generic circuit that especially benefits from a judicious choice of processing space, resulting in a fully pipelined digital system that does not require a framestore and maximizes accurate signal handling with a minimum of functional elements. By additionally separating the critical interpolations and multiplications from the ones that can be approximated, and the known multipliers from ones that must be calculated from the signal stream or from arbitrary input conditions, the architecture of the pre-processor circuit can be designed to relate to an efficient choice of processing space, that is, to linear or logarithmic space, rather than to a slavish transposition from its analog ancestry.

The invention thus departs from a mere replacement of prior art elements with digital circuits, and instead focuses upon a minimal space-wise sectioning of a digital process for operating upon signals from a single chip multi-color image sensor. The sensor has a two-dimensional pattern of photosites producing luminance and chrominance image signals. The pre-processor circuit includes two processing sections separated by processing space. The first section processes the image signals in quantized linear space, providing therein means for interpolating additional luminance values for the pixel locations that produce chrominance signals. The output of the first section includes a fully interpolated stream of quantized luminance signals and an uninterpolated stream of quantized chrominance signals. The second section processes the output of the first section in quantized log space, providing means for generating a quantized hue signal from the chrominance and luminance signals and means for interpolating additional hue values for pixel locations that produce luminance signals. The output of the second section is a fully interpolated stream of quantized color signals.

As the first section processing is done in linear space, multiplications (or divisions) with known multipliers (or divisors) can be implemented with simple right shifts. Consequently, this section further includes a black reference clamp for establishing a black reference value from the average signal value of a predetermined number of image pixels and means for subtracting the black reference value from each image signal. Since the second section is in quantized log space, multiplications (or divisions) with as yet undetermined coefficients become adds (or subtracts). The second section thus includes means for controlling the white balance of the hue signal according to an average color value subtracted from each log hue signal (corresponding to division in linear space) and means for modifying the signal gain of the log green signal according to a gain offset value input to the second section. Finally the hue signal is converted back into chroma and the output is a set of fully interpolated color signals.

BRIEF DESCRIPTION OF THE DRAWINGS

The invention will be described in relation to the drawings, in which.

DETAILED DESCRIPTION OF THE INVENTION

Figure 1:
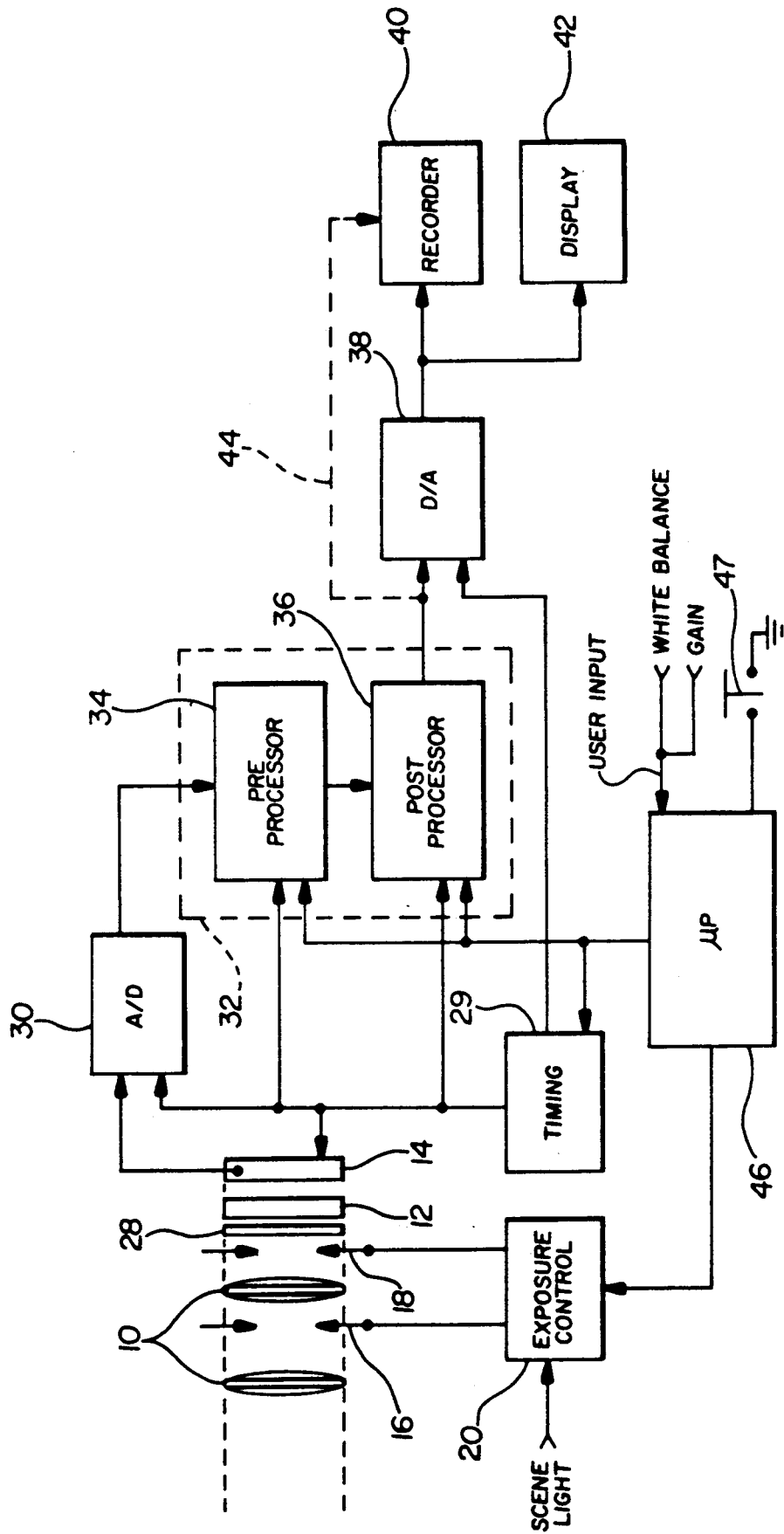
FIG. 1 is a block diagram showing a digital processor included in a still video camera for use according to the invention.

FIG. 1 identifies the basic elements of a still video camera including a digital processor of the type embodied by the invention. Other elements of the camera, either omitted or not shown in detail, may be readily selected from like elements known in the art. For example, the exposure control, recorder and display sections of the camera, which are not essential to an understanding of the invention, may be provided by ordinary components well known in this art. The microprocessor control system and the timing circuit, which peripherally relate to the invention, may be implemented in a wholly conventional manner using available components and techniques. Moreover, although the digital processor is disclosed in connection with a still video camera, the invention is not necessarily related to this mode of image capture and, for example, could be incorporated into a film-to-video converter or a motion video system.

Referring to FIG. 1, the still video camera includes an optical section 10 for directing image light from a subject (not shown) through a color filter 12 to an image sensor 14. A diaphragm 16 regulates the optical aperture through which image light passes and a shutter 18 regulates the exposure time of image light upon the image sensor 14. As is well known, exposure is a function of light intensity and time, which are respectively controlled by the diaphragm 16 and the shutter 18. A sample of the scene light is input to an exposure control circuit 20, which automatically operates the diaphragm 16 and the shutter 18 based on exposure mode or other conventional user inputs (not shown).

Figure 2:
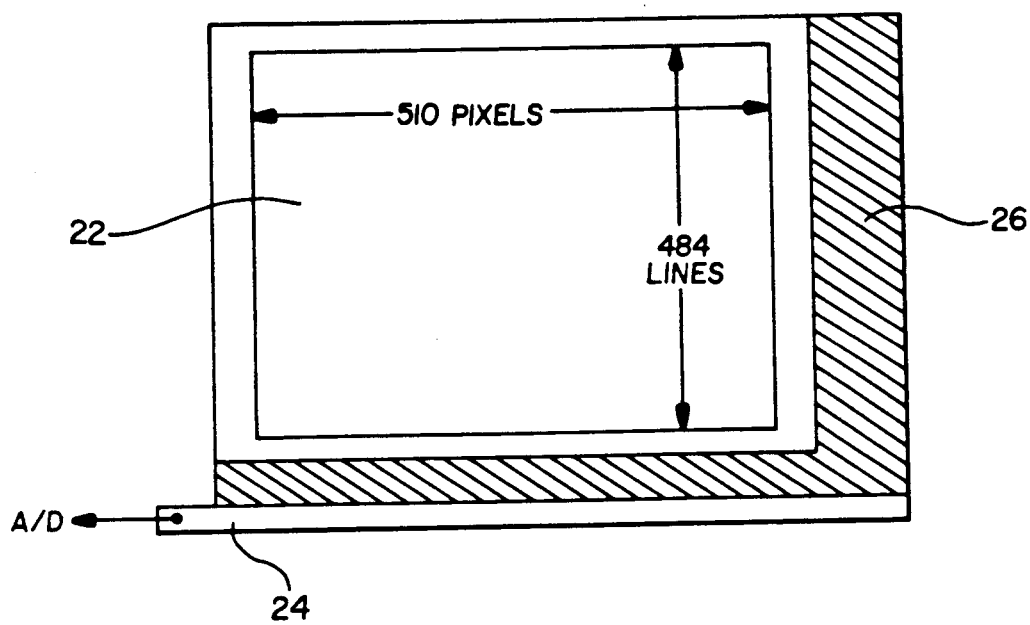
FIG. 2 is a plan view of the image sensor used in the camera of FIG. 1.
Figure 3:
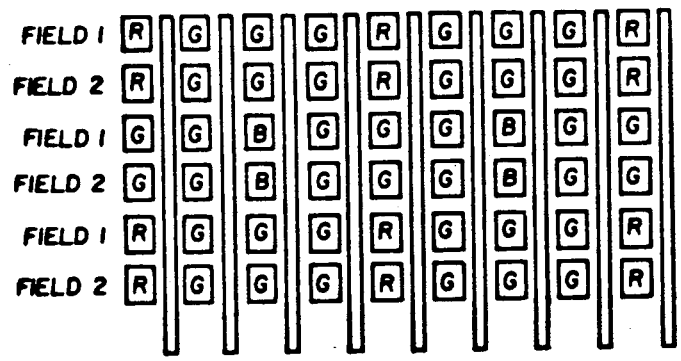
FIG. 3 shows a portion of the color filter pattern used in connection with the image sensor.

The image sensor 14 is shown in plan view in FIG. 2. For purposes of illustrating a typical application, the sensor 14 includes an active image area 22 having a horizontal resolution of 570 pixels and a vertical resolution of 484 lines. (The invention, however, is not limited to any particular configuration or size of image sensor.) The pixels are arranged in a known interline transfer configuration in which separate fields are transferred line by line to an output register 24. A cross-hatched area 26 shows a region of dark lines and dark pixels which are used to obtain an indication of "dark current". FIG. 3 shows a preferred color filter geometry for the color filter 12, specifically a "three-green" color filter geometry of the type disclosed in U.S. Pat. No. 4,663,661, which is assigned to the assignee of the present invention and incorporated by reference into the present description. This type of filter produces red, green and blue signals, which can also be considered luminance (green) and chrominance (red or blue) colors. To implement the type of interpolation processing disclosed in that patent, a blurring filter 28 (FIG. 1) is placed in front of the color filter 12 to prefilter the image light according to a known spread function.

The "three-green" color filter array is additionally arranged in a "checkerboard" geometry in accordance with the teaching of U.S. Pat. No. 3,971,065, which is also assigned to the assignee of the present invention and incorporated by reference into the present description. The image sensor and color filter array shown in FIGS. 2 and 3 are disclosed in relation to a specific embodiment of the invention, rather than as a necessary element of the invention. The digital processor (to be described) may be implemented with any single chip color-sensitive image sensor. Of course, the interpolation processing has to be adapted to the particular color geometry being used. Also, with other color filtering techniques, the blurring filter 26 may be altered or omitted.

In FIG. 1, a timing circuit 29 is provided for clocking the image signal from the output register 24 (FIG. 2) of the image sensor 14 to an analog-to-digital (A/D) converter circuit 30 and for generally sequencing other sections of the camera. The timing circuit operates at three times the color subcarrier, that is, about 10.7 MHz. A conventional flash converter that operates at such video rates is used as the A/D converter 30. The digital signal generated by the A/D converter 30 is a linearly quantized signal of, for example, 8 bits resolution and is output as a stream of color signals comprising, for the color filter array of FIG. 3, a sequence of red (or blue) signals separated by three green signals. The quantized color signals are applied to a digital signal processing circuit 32 composed of two sections: a pre-processor section 34 and a post-processor section 36. The signal provided to the digital processing circuit 32 is partial resolution color data from the image sensor 14, that is, an un-interpolated sensor signal incorporating any anomalies due to the black level of the sensor or to any color and density irregularity in the scene. (The signal input to the pre-processor 34 can also be an 8 bit non-linearly quantized, e.g., log quantized, input signal, which allows some of these anomalies, such as visible quantization distortion, to be minimized while keeping A/D cost low. In that case the A/D converter 30 would be preceded by a log amplifier to provide log signals to the converter 30.) The signal output from the circuit 32 is a fully corrected, fully interpolated multicolor signal. The signal passed between the pre-processor 34 and the post-processor 36 includes fully interpolated color data without the aforementioned anomalies but absent any corrections for subjective image improvement.

The fully corrected color signals from the digital processor 32 are converted to analog signals by a digital-to-analog (D/A) converter 38 and are sent to either a conventional recorder 40 or to a display device 42. (The broken line 44 is meant to indicate that the color signals may be directly recorded in a digital storage device, if such is the choice.) A microprocessor 46 controls the operation of the camera and allows for user entry of pre-processor information, such as gain offset and color balance, to the pre-processor 34. A button 47 is depressed to enable the automatic white balance operation, which requires pointing the optical section 10 at a white card or like white standard.

A key feature of the system is that the pre-processor 34 is fully pipelined so that "raw" red, green and blue data from the image sensor 14 is processed and provided to the post-processor 36 in real time, that is, without the need for any external storage, such as a framestore. It is envisioned that post-processing (in the post-processor 36) would also be in real time, but that is not a necessary adjunct of the invention. ("Real-time" includes the normal video operating rate of the image sensor 14, i.e., sixty video fields per second, or any comparable rate that is rapid enough to permit ordinary photography.)

Figure 4:
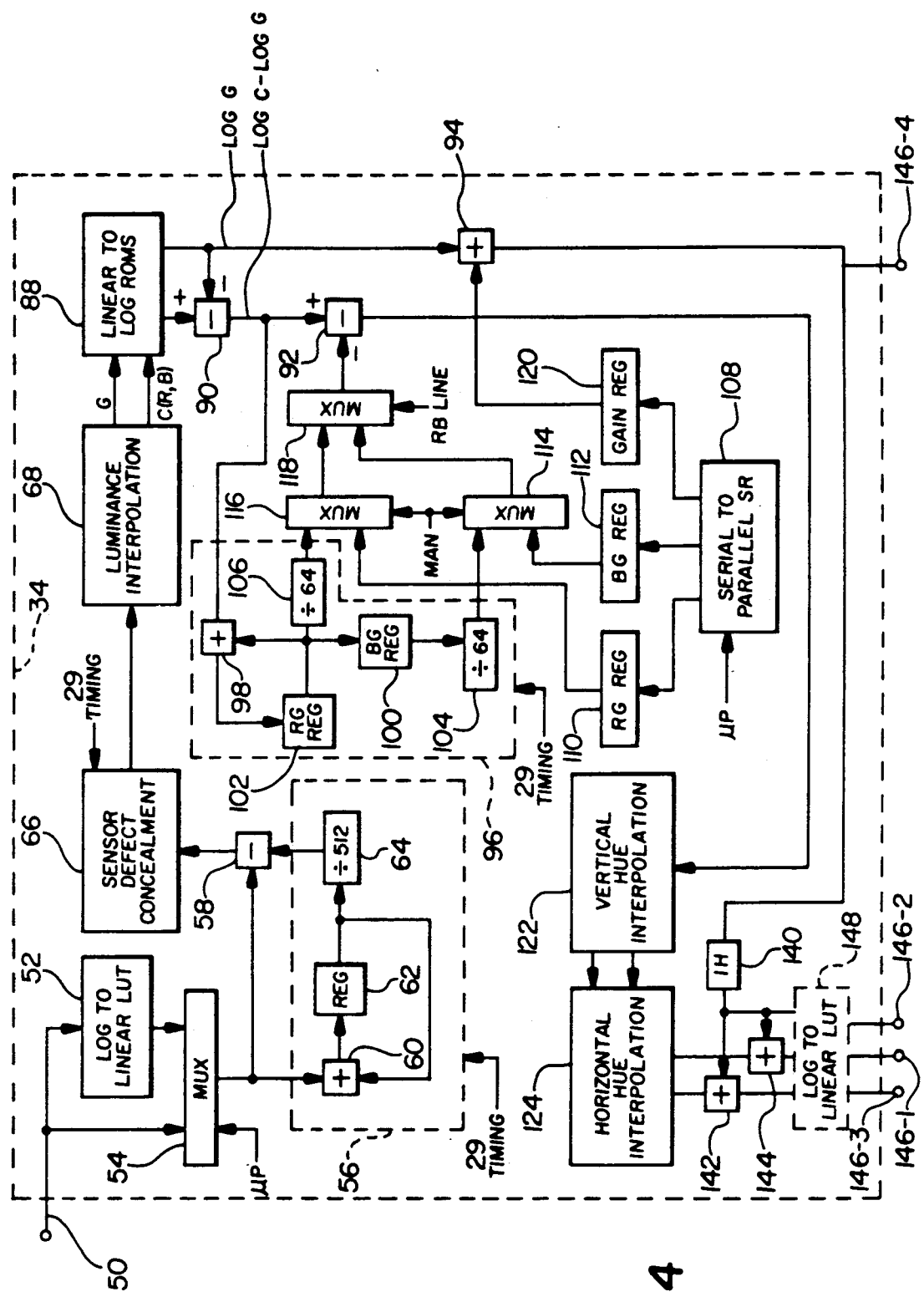
FIG. 4 is a detailed block diagram of the digital pre-processor shown in FIG. 1.

FIG. 4 shows the basic architecture of the digital pre-processor 34, which is preferably implemented in a single integrated circuit. An input 50 to the pre-processor 34 receives either 10 bit linearly quantized or 8 bit non-linearly (log) quantized signals from the A/D converter 30. A read only memory (ROM) look-up table (LUT) 52 maps from the non-linearly quantized (log) input signal to a 10 bit linear signal value, which generally represents the bit resolution handled by the pre-processor 34. A multiplexer 54 has two inputs, one connected to the terminal 50 and the other to the ROM 52. The multiplexer 54 is switched by the microprocessor 46 (or hard-wired according to the application) according to the type of input signal, that is, whether the input signal is log or linear, thus providing an output that is always linear. This is important because the initial processing steps of black level clamping and luminance interpolation are desirably completed in linear, space, where the adjustments will be in direct, linear relation to the charge signal amplitudes existing on the image sensor.

The signal from the multiplexer 54 is applied to a black reference generator 56 and to a black reference clamp 58, which are used to establish a stable sensor black reference value for the entire image. The black reference is an average thermal dark current noise correction offset value for the sensor, which, unless removed from the signals, will corrupt all subsequent adjustments and corrections. The black reference generator 56 is enable by the timing circuit 29 (FIG. 1) before the image area 22 (FIG. 2) is scanned from the image sensor 14 in order to collect a sample of dark current signal values from 512 pixels in the non-displayed and non-imaged dark area 26 of the image sensor 14. Since the digital value of each dark pixel is quite small, only the seven least significant bits are summed by a summer 60 and stored in a register 62. The sum is averaged in a right-shifting circuit 64 by truncating the nine least significant bits of the sum. As the image values of the pixels from the active image area 22 are subsequently processed, the average black reference value is subtracted from each pixel value in the clamp 58.

Figure 6:
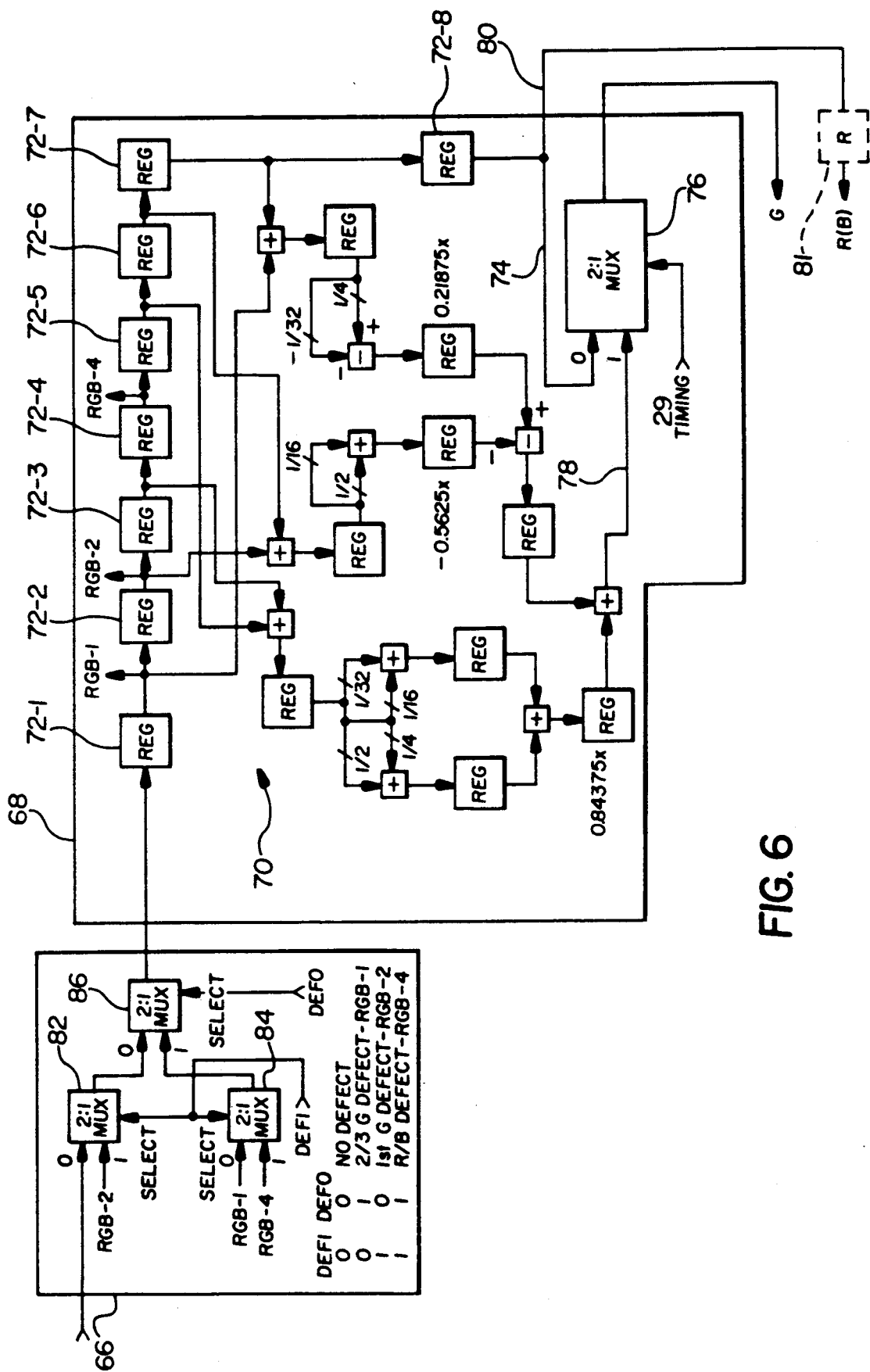
FIG. 6 is a detailed diagram of the defect concealment and luminance interpolation blocks shown in FIG. 4.

The clamped signals are applied to a sensor defect concealment circuit 66, which conceals defective pixels by substituting the value of the closest previous horizontally adjacent pixel of the same color. The defective pixels are predetermined as to location by a defect table (not shown), which controls operation of the circuit 66. The stream of pixel signals is next applied to a luminance pixel interpolation circuit 68. Further details of the circuits 66 and 68 are shown in FIG. 6. Turning first to the luminance interpolation circuit 68, it should be first noted that one-quarter of the pixel locations, namely, those collecting red and blue information, are missing a luminance, or green, value. The circuit 68 interpolates a green value for these locations (the missing green pixels) by using a horizontal 6th order finite impulse response (FIR) digital filter 70 of the type disclosed in the above-mentioned U.S. Pat. No. 4,664,661.

The digital filter 70 includes a set of coefficients 0.21875, −0.5625, 0.84375, X, 0.84375, −0.5625, and 0.21875, implemented in hard-wired form by the combination of right-shifts, adds and subtracts as shown in FIG. 6. (The adders are denoted by "+", the differences by "−", and the right-shifts by a slash "/" with the binary division next to it. The registers denoted "REG" provide the necessary timing delay for pipelined operation.) These coefficients are no more than 0.01 different than the coefficient values calculated according to the technique disclosed in the aforementioned U.S. Pat. No. 4,663,661, and they maintain the identical d.c. response. The number of adders is minimized by initially summing the signal values for which the same coefficients are used, so that the same multiplications can be applied to the combined signals.

The red, green and blue signal values are applied to a series of registers 72-1 to 72-8 which are clocked at the pixel rate and therefore each provide one pixel delay to the signal. The actual green values are passed through the registers 72-1 to 72-8 and are applied on a line 74 to the "0" input of a multiplexer 76. The calculation of a missing green pixel commences when a pixel configuration of "(G) (G) (G) (R/B) (G) (G) (G)" is present at the respective inputs of the registers 72-2 to 72-8. The missing green calculation is then incrementally completed in the pipelined architecture of adders, subtractors, and right-shifts. For every fourth iteration of the clock, the missing green value is present on a line 78 at the "1" input to the multiplexer 76. At the same time a red or blue value arrives at the input "0". The timing circuit 29 then switches the multiplexer 76 to instead pass the missing green value at the input "1". Consequently the output of the multiplexer 76 is a fully interpolated luminance (green) signal, that is, a signal stream with green values for every pixel location. Since every fourth value of the stream of signals input to the "0" terminal of the multiplexer 76 is a chroma (red or blue) signal value, the chroma values are tapped off on a line 80 for subsequent processing (as an uninterpolated chroma signal). For this purpose, a register 81 can be clocked for every fourth pixel or the subsequent operation (linear to log) can be enabled for every fourth pixel (red or blue). In this manner, a line sequence of red and blue signals is separated from a fully interpolated luminance signal.

The sensor defect concealment circuit 66, as shown in FIG. 6, uses the delay registers 72-1, 72-2, 72-3 and 72-4 from the interpolation circuit 68 to provide the necessary pixel delays for locating the closest previous horizontally adjacent pixel of the same color. Delayed pixels RGB-1, RGB-2 and RGB-4 are applied to the multiplexers 82 and 84 along with the present pixel. The outputs of these multiplexers are passed to a third multiplexer 86. From the defect table maintained in memory, the timing circuit 29 (FIG. 1) enables the appropriate multiplexers 82, 84 and 86 in a two stage process (as illustrated by the select table) to output a stream of signals including, as required, replacements for defective pixels.

Referring back to FIG. 4, the fully interpolated green signal and the uninterpolated chroma (red and blue) signal are transformed into an approximately logarithmically quantized space by a set of linear to log ROM look up tables 88. This transformation is useful and desirable because the following signal processing operations involve multiplications (or divisions) with as-yet undetermined multipliers (or divisors), which makes hard-wired right shifts impractical. Moreover, the chroma processing is to involve hues, that is, the ratio of red or blue to green, rather that the red or blue values themselves. As is noted before, it is known that interpolating hue values rather than red or blue values greatly reduces false colors in areas with a significant amount of luminance detail.

Being in log space, the ratio of red or blue to green is generated by subtracting the log green from the log chroma signals in a subtracting circuit 90, which provides a line sequence of log blue-log green and log red-log green signals. Next, the white balance and gain are adjusted. A white balance offset value is subtracted from the log blue-log green and log red-log green values (in a subtracting circuit 92) to achieve the proper white balance and a gain offset value is summed with the log green value (in a summing circuit 94) to adjust the signal gain. The white balance offset value is obtained from either of two sources, as follows. An automatic white balance circuit 96 computes the average of 64 log blue-log green values and 64 log red-log green values when enabled by the microprocessor 46 via the timing circuit 29 (FIG. 1). During this procedure, the user is aiming the camera at a white card while pressing the "white balance" button 47 as shown by FIG. 1. The respective totals are iteratively summed in the adder circuit 98 and stored in the respective registers 100 and 102. A right-shift by six bits in the respective shift circuits 104 and 106 averages both values.

Rather than automatic white balance, a white balance offset may alternatively be supplied by the microprocessor 46 from the user input settings to a double buffered interface, including a serial-to-parallel shift register 108 and a pair of static, parallel input registers 110 and 112. The white balance offset is serially written into the shift register 108, which allows white balance to be changed without causing the color and level of the image to change erratically. At a selected moment during the vertical retrace interval the respective white balance offsets for the log red-log green and log blue-log green signals are loaded into the static registers 110 and 112. The selection between automatic white balance and a manually inserted white balance is made by appropriately controlling a pair of multiplexers 114 and 116. These multiplexers are connected to a third multiplexer 118, which connects with the subtracting circuit 92 and does the line sequential selection between log red-log green and log blue-log green offsets. By loading the registers 110 and 112 during the vertical retrace interval, white balance is changed without erratically adjusting the picture during an image scan. The gain offset is similarly input from the microprocessor 46 through the shift register 108 to a static gain register 120. The gain addition circuit 94 is connected to the output of the register 120.

The log hue signal, following white balancing, is applied first to a vertical hue interpolation circuit 122 and secondly to a horizontal hue interpolation circuit 124. These circuits are shown in greater detail in FIG. 7, which uses a pipelined architecture (with the network of registers denoted "REG"). Two points should be noted: First, separating the interpolation into two dimensions, and doing the vertical interpolation first, allows vertical delay to be carried out with two ¼ line delays 126 and 128, rather than the full line delays that would be needed if the vertical interpolation was done after, or with, horizontal interpolation. (This is because the log hue signals represent ¼ full resolution at this point in the processing.) Secondly, hue interpolation in log space in this particular case is a sufficient approximation of hue interpolation in linear space since the hue values being interpolated are based on accurate sensor values of red and blue for every fourth pixel (albeit not the same pixel). The resultant small errors in interpolation are unnoticeable, in part because the eye is less sensitive to hue changes than to luminance changes.

Figure 7:
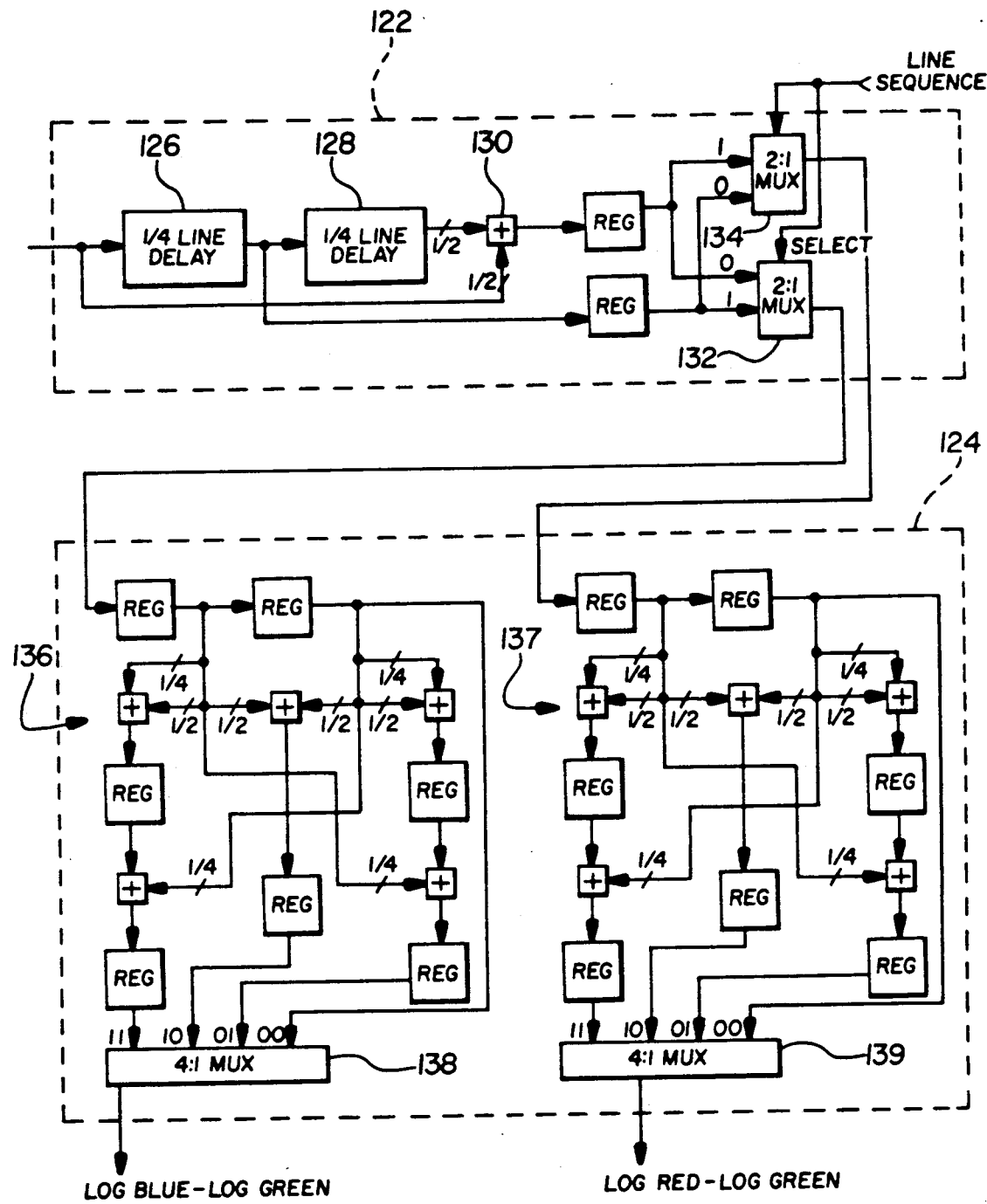
FIG. 7 is a detailed diagram of the horizontal and vertical chroma interpolation blocks shown in FIG. 4.

Vertical interpolation is obtained by applying either a one-line delayed signal value or an average of the lines adjacent to the one-line delayed signal (from the adding circuit 130) to a pair of multiplexers 132 and 134. The inputs to the multiplexers are toggled for alternate lines to provide a continuous stream of vertically interpolated values to a log blue-log green horizontal interpolator 136 and to a log red-log green horizontal interpolator 137. The horizontal interpolation in each case is obtained by using a polyphase finite impulse response (FIR) filter. The four FIR phases, having coefficients (1, x, x, x, 0), (0.75, X, x, x, 0.25), (0.5, x, X, x, 0.5), and (0.25, x, x, X, 0.75), are implemented for each hue by using the six registers, five adders and a 4:1 multiplexer 138 (or multiplexer 139) as shown in FIG. 7 for each interpolator. Each fractional coefficient is factored into powers of two that are implemented by right shift operations, as shown.

The output of the multiplexer 138 is a fully interpolated log blue-log green (hue) signal, and the output of the multiplexer 139 is a fully interpolated log red-log green (hue) signal. Meanwhile, the log green signal has been delay equalized in a full line delay 140 (FIG. 4). The fully interpolated log blue-log green and log red-log green signals are respectively summed with the delayed log green signal in a blue addition circuit 142 and a red addition circuit 144. The output of these addition circuits plus the delayed log green signals comprise the output of the integrated circuit 34 (FIG. 4), namely, fully interpolated, uncorrected logarithmic red, green and blue signals provided at terminals 146-1, 146-2, and 146-3, respectively.

In addition, the undelayed log green signal is provided at an output terminal 146-4. This output, along with the one line delayed green signal at output terminal 146-2, is useful in post processing, such as for edge enhancement. Although the integrated circuit 34 was designed to produce a log output, a linear or gamma-corrected output may be obtained if an (optional) log to linear or log to gamma-corrected space ROM look up table 148 is inserted into the signal channels before the outputs 146-1 to 146-3. (In that case it may be desirable to transform the output 146-4 to linear or gamma-corrected space as well.)

Figure 5:
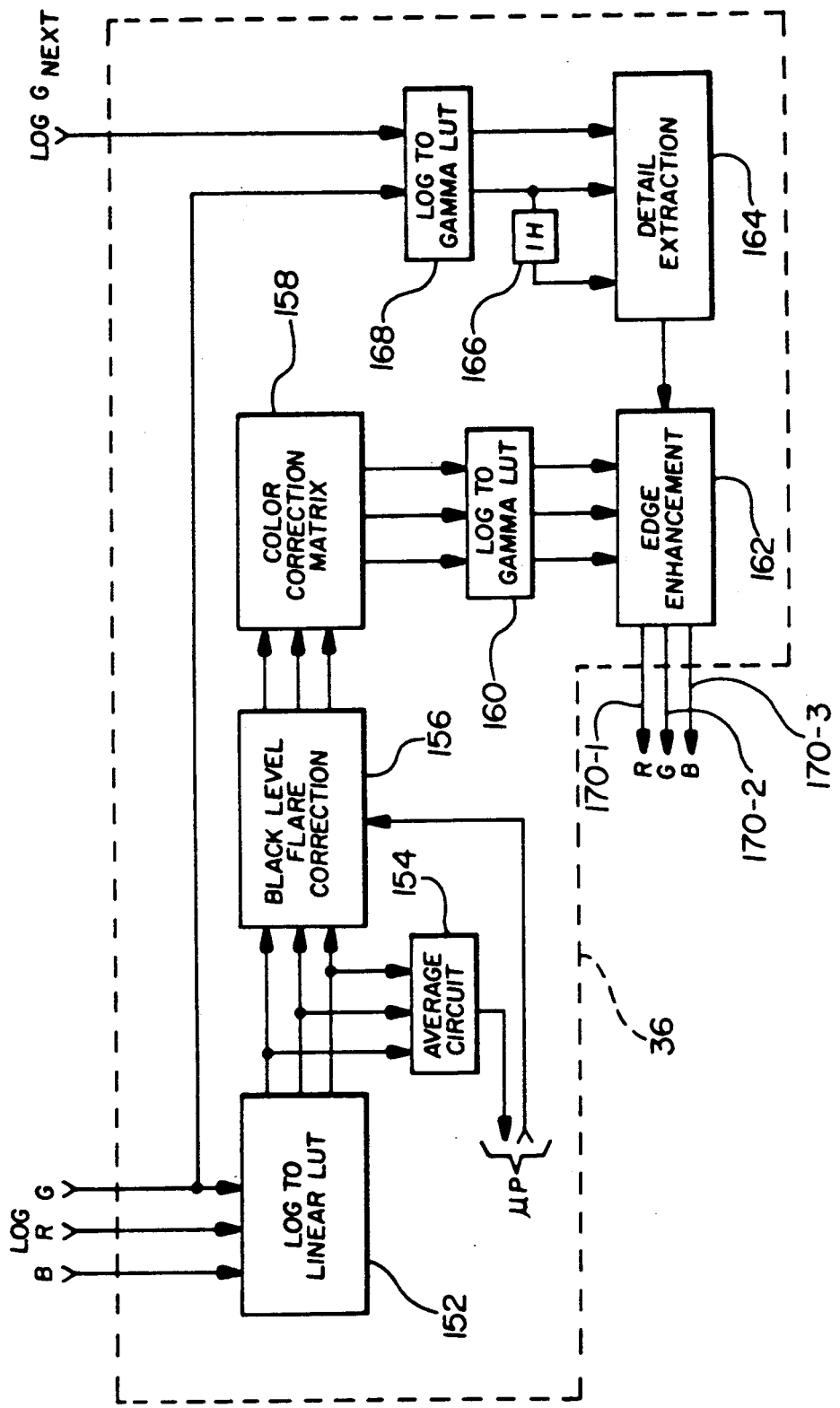
FIG. 5 is a detailed block diagram of the digital post-processor shown in FIG. 1.

Referring now to FIG. 5, the fully interpolated red, green and blue signals are subjected to a number of signal corrections and improvements in the post-processing integrated circuit 36. If not previously converted, the logarithmic red, green and blue signals are transformed into linear signals in a log to linear ROM look-up table 152. The black level is corrected for lens flare by separately integrating the scene intensity in each color in an averaging circuit 154 and then subtracting a certain percentage of this average (depending on the lens quality) from every pixel of the image in a correction circuit 156. The raw averages are sent to the microprocessor 46 for processing and the corrected averages (corrected for the actual lens) are then loaded into an offset register (not shown) in the correction circuit 156. In addition, a further user-specified black level "set-up" value can be added to or subtracted from the average by the microprocessor 46.

The linearly quantized red, green, and blue signals are next matrixed with a color correction matrix 158 in order to properly correct the spectral sensitivities of the image sensor for the chromaticities of the display 42 (FIG. 1). The matrixed red, green and blue signals are then gamma-corrected in a log to gamma ROM look-up table 160, which provides suitable curve shape transformations to adjust the non-linear contrast relationship between signal voltages at the input (sensor 14) and the light values at the output (e.g. display 42) of the system.

The gamma corrected red, green and blue signals are next processed in an edge enhancement circuit 162 to improve the subjective sharpness of the image. The image detail is extracted from the lines of the green signal in a detail extraction circuit 164. Two lines of green are provided directly from the pre-processor circuit 34 at terminals 146-2 and 146-4 and an additional line delay is added by a line delay circuit 166. If the two green input signals are logarithmic, a log to gamma ROM look-up table 168 is provided to convert the log signals to gamma corrected signals (if linear, the conversion would be linear to gamma). The digital output of the post-processor integrated circuit 36 is a fully interpolated red, green and blue signal provided at the output terminals 170-1, 170-2, and 170-3.

The disclosed post-processing circuit 36 is preferably implemented in a fully-pipelined architecture so that it can be incorporated into a fully real-time system, such as that of a video still camera. Such is not, however, a necessary adjunct of the invention, according to which the pre-processing circuit 34 provides fully interpolated, real-time red, green and blue signals. The uncorrected output of the circuit 34 may be directly applied to the recorder 40 (either with or without D/A conversion in the converter 38), thus bypassing post-processing and rendering the circuit 36 unnecessary in such an application. Furthermore, in certain applications, post-processing may involve use of a framestore (not shown) and operation in other than real-time. Obviously, in such applications, the post processing circuit 36 would not be used as shown in FIG. 5 but would incorporate a framestore in combination with the processing functions. Fewer, or additional, correction and improvement functions may also be provided.

The invention has been described in detail with particular reference to a presently preferred embodiment, but it will be understood that variations and modifications can be effected within the spirit and scope of the invention.

What is claimed is:

1. A digital circuit for generating a fully interpolated color signal from a single, multi-color image sensor having a two-dimensional pattern of photosites producing luminance and chrominance image signals corresponding to discrete, and respectively separate, pixel locations, said circuit comprising:

(a) a first digital processing section for operating upon signals that are linearly related to the sensor signal level; said first section including:

a black reference clamp for establishing a black reference value from the average black signal value of a predetermined number of pixels on the image sensor;

means for subtracting the black reference value from each image signal;

means for replacing image signals obtained from defective pixels with image signals from nearby pixels of the same color; and means for interpolating additional luminance values for the pixel locations that produce chrominance signals, said interpolating means combining the signal values of nearby luminance pixels according to a predetermined algorithm, said interpolating means providing therefrom a fully interpolated stream of luminance signals and an uninterpolated stream of chrominance signals; and (b) a second digital processing section for operating upon signals that are logarithmically related to the sensor signal level, said second section including:

means for generating logarithmic luminance and chrominance signals from the fully interpolated luminance image signals and from the uninterpolated chrominance image signals;

means for generating a log hue signal from the log chrominance and log luminance signals;

means operating upon the log hue signal for controlling white balance according to an offset value subtracted from the log hue signal;

means operating upon the log luminance image signal to modifiy signal gain according to a gain offset value input to the second processing section;

means for interpolating additional hue values for the pixel locations that produce luminance signals, said hue interpolating means combining the signal values of nearby chrominance pixel locations according to a predetermined algorithm; and means for generating a fully interpolated color signal from said interpolated hue and luminance image signals.

2. A circuit as claimed in claim 1 in which said first processing section includes means operating upon the signal input to said first processing section for providing a linear transformation of the input signal.

3. A circuit as claimed in claim 1 in which said black reference clamp calculates a black reference value from the average signal value of a plurality of non-exposed image pixels.

4. A digital processor for generating a fully interpolated color signal from a single, multi-color image sensor having a two dimensional pattern of photosites producing luminance and chrominance image signals corresponding to discrete, and respectively separate, pixel locations, said processor comprising:

a first processing section for digitally processing the image signals in quantized linear space, said first section including means for interpolating additional luminance values for the pixel locations that produce chrominance signals, the output of the first section comprising a fully interpolated stream of quantized luminance signals and an uninterpolated stream of quantized chrominance signals; and a second section for digitally processing the output of the first section in quantized log space, said second section including means for generating a quantized log hue signal from the difference between the chrominance and luminance signals in log space and means for interpolating additional hue values for the pixel locations that produce luminance signals, the output of said second section comprising a fully interpolated stream of quantized color signals.

5. A digital processor as claimed in claim 4 in which said first processing section further includes means for establishing a black reference value from an average black signal value of a predetermined number of pixel locations and means for subtracting the black reference value from each quantized image signal.

6. A digital processor as claimed in claim 4 in which said second processing section further includes means for controlling the white balance of the log hue signal according to a white balance offset value that is combined with the log hue signal.

7. A digital processor as claimed in claim 6 in which said white balance offset value is generated from an average white signal value of a predetermined number of image pixel locations.

8. A digital processor as claimed in claim 4 in which said second processing section further includes means for modifying signal gain according to a gain offset value that is combined with the log luminance signal.

9. A digital integrated circuit for generating a fully interpolated color signal from a single, multi-color image sensor having a two-dimensional pattern of photosites producing red, green and blue image signals corresponding to discrete, and respectively separate, pixel locations, said circuit comprising:

(a) a first digital processing section for operating upon signals that are linearly related to the sensor signal level; said first section including:

a black reference clamp for establishing a black reference value from the average black signal value of a predetermined number of non-exposed pixels on the image sensor;

means for subtracting the black reference value from each image signal;

means for replacing image signals obtained from defective pixels with image signals from nearby pixels of the same color;

means for producing an uninterpolated line-sequential stream of red and blue image signals; and means for for interpolating additional green values for the pixel locations that produce either red or blue signals, said interpolating means combining the signal values of nearby green pixels according to a predetermined algorithm implemented in a bit-shifting hardware configuration, said interpolating means providing therefrom a fully interpolated stream of green signals; and (b) a second digital processing section for operating upon signals that are logarithmically related to the sensor signal level, said second section including:

means for generating logarithmic red, green and blue signals from the fully interpolated green image signals and from the uninterpolated red and blue image signals;

means for generating a log hue signal from the difference between the line sequence of log red or blue and log green signals;

means operating upon the log hue signal for controlling white balance according to an offset value subtracted from the log hue signal;

means operating upon the log green image signals to modify signal gain according to a gain offset value input to the second processing section;

means for interpolating additional hue values for the pixel locations that produce green signals, said hue interpolating means combining the hue signal values of nearby red or blue pixel locations according to a predetermined algorithm; and means for generating a fully interpolated color signal from said interpolated log hue and log green image signals.

* * * * *

UNITED STATES PATENT AND TRADEMARK OFFICE
CERTIFICATE OF CORRECTION

PATENT NO. : 5,008,739
DATED : April 16, 1991
INVENTOR(S) : Lionel J. D'Luna et al It is certified that error appears in the above-identified patent and that said Letters Patent is hereby corrected as shown below:

On the title page:

Title "REAL-TIME DIGITAL PROCESSOR FOR PRODUCING FULL RESOLUTION COLOR SIGNALS FROM A MULTI-COLOR IMAGE SENSOR"

should read --REAL-TIME DIGITAL PROCESSOR FOR PRODUCING FULLY INTERPOLATED COLOR SIGNALS FROM A MULTI-COLOR IMAGE SENSOR--;

Abstract, line 6, "signle" should read --single--;

Column 11, line 9, after "the" insert --hue--;

Column 10, line 44, "the" should read --an--; and

Column 12, line 17, "the" should read --an--.

Signed and Sealed this

Twenty-seventh Day of October, 1992

*Attest:*

DOUGLAS B. COMER

*Attesting Officer*     *Acting Commissioner of Patents and Trademarks*